(12) United States Patent
Kim et al.

(10) Patent No.: US 8,358,174 B2
(45) Date of Patent: Jan. 22, 2013

(54) DOHERTY AMPLIFIER

(75) Inventors: Dong Young Kim, Gyeonggi-do (KR);
Jae Woan Byun, Seoul (KR); Sung Ho Shin, Seoul (KR); Kyoung Joon Kim, Seoul (KR); Chan Young Park, Gyeonggi-do (KR)

(73) Assignee: SK Telecom Co., Ltd., Seoul (KR)

( * ) Notice: Subject to any disclaimer, the term of this patent is extended or adjusted under 35 U.S.C. 154(b) by 0 days.

(21) Appl. No.: 13/464,460

(22) Filed: May 4, 2012

(65) Prior Publication Data

US 2012/0223775 A1  Sep. 6, 2012

Related U.S. Application Data

(63) Continuation of application No. PCT/KR2010/007696, filed on Nov. 3, 2010.

(30) Foreign Application Priority Data

Nov. 4, 2009  (KR) .................. 10-2009-0105746

(51) Int. Cl.
*H03F 3/68* (2006.01)
(52) U.S. Cl. ...................................... 330/295
(58) Field of Classification Search ............. 330/124 R, 330/295, 307
See application file for complete search history.

(56) References Cited

U.S. PATENT DOCUMENTS

| 6,798,295 B2* | 9/2004 | Pengelly et al. ............. 330/295 |
| 6,903,612 B2 | 6/2005 | Toncich et al. |
| 7,663,435 B2* | 2/2010 | Kim et al. ................. 330/124 R |
| 8,228,123 B2* | 7/2012 | Blednov ........................ 330/295 |
| 2004/0037044 A1* | 2/2004 | Cook et al. .................... 361/719 |
| 2010/0007412 A1* | 1/2010 | Wang et al. ............... 330/124 R |

FOREIGN PATENT DOCUMENTS

| JP | 2006-345341 | 12/2006 |
| JP | 2008-017072 | 1/2008 |
| JP | 2008-113202 | 5/2008 |
| KR | 10-2007-0005455 | 1/2007 |

OTHER PUBLICATIONS

International Search Report mailed Jul. 13, 2011 for PCT/KR2010/007696, citing the above references.

\* cited by examiner

*Primary Examiner* — Steven J Mottola
(74) *Attorney, Agent, or Firm* — Lowe Hauptman Ham & Berner, LLP

(57) ABSTRACT

The embodiment relates to a Doherty amplifier, wherein in order to perform impedance matching. The embodiment comprises an impedance converter and a connector. The impedance converter includes a plurality of lines having different lengths and disposes between an output end of a carrier amplifier and an output end of a peaking amplifier. The connector connects a line selected from the plurality of lines having different lengths of the impedance converter to the output end of the carrier amplifier and to the output end of the peaking amplifier.

14 Claims, 5 Drawing Sheets

[FIG. 1]
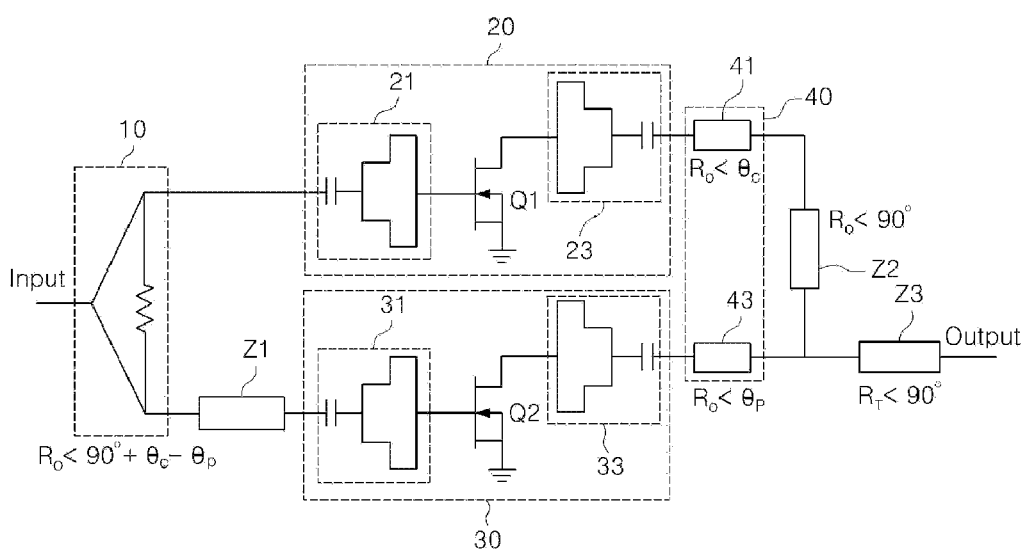

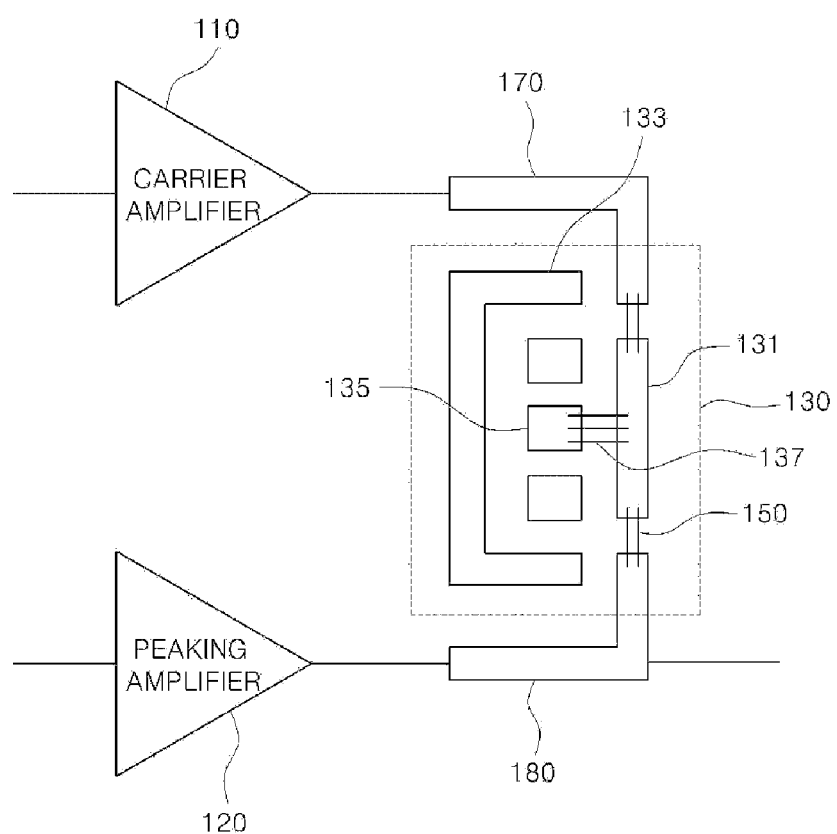
[FIG. 2]

[FIG. 3]
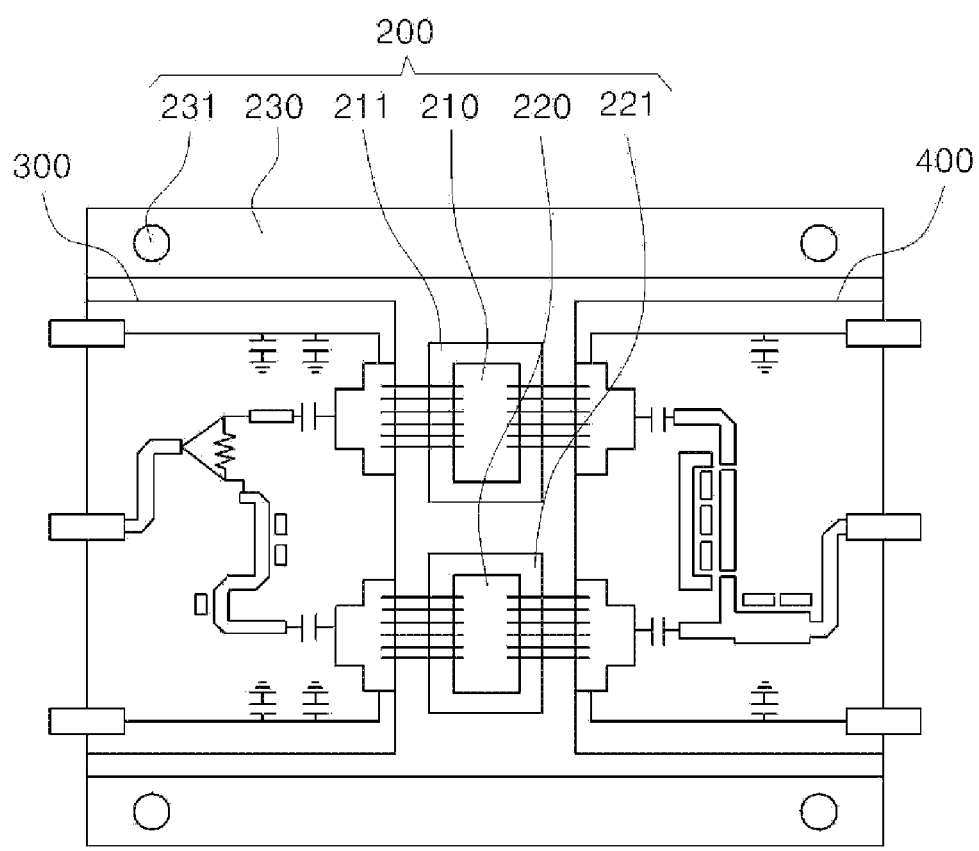

[FIG. 4]
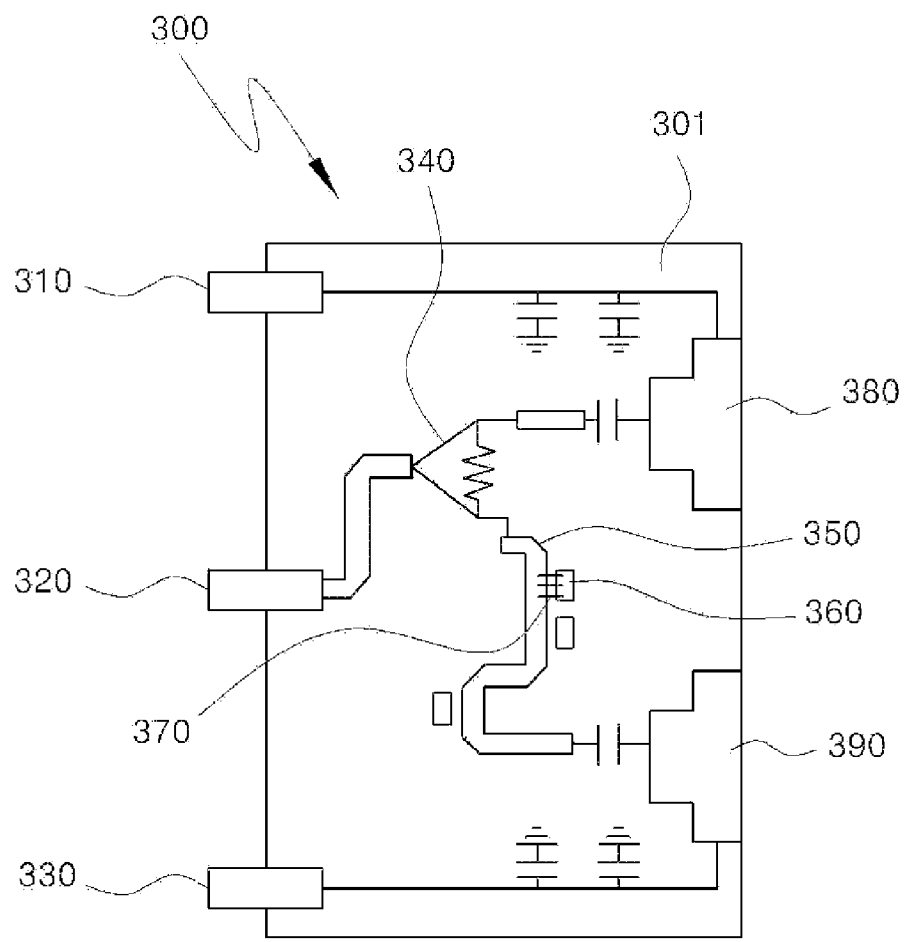

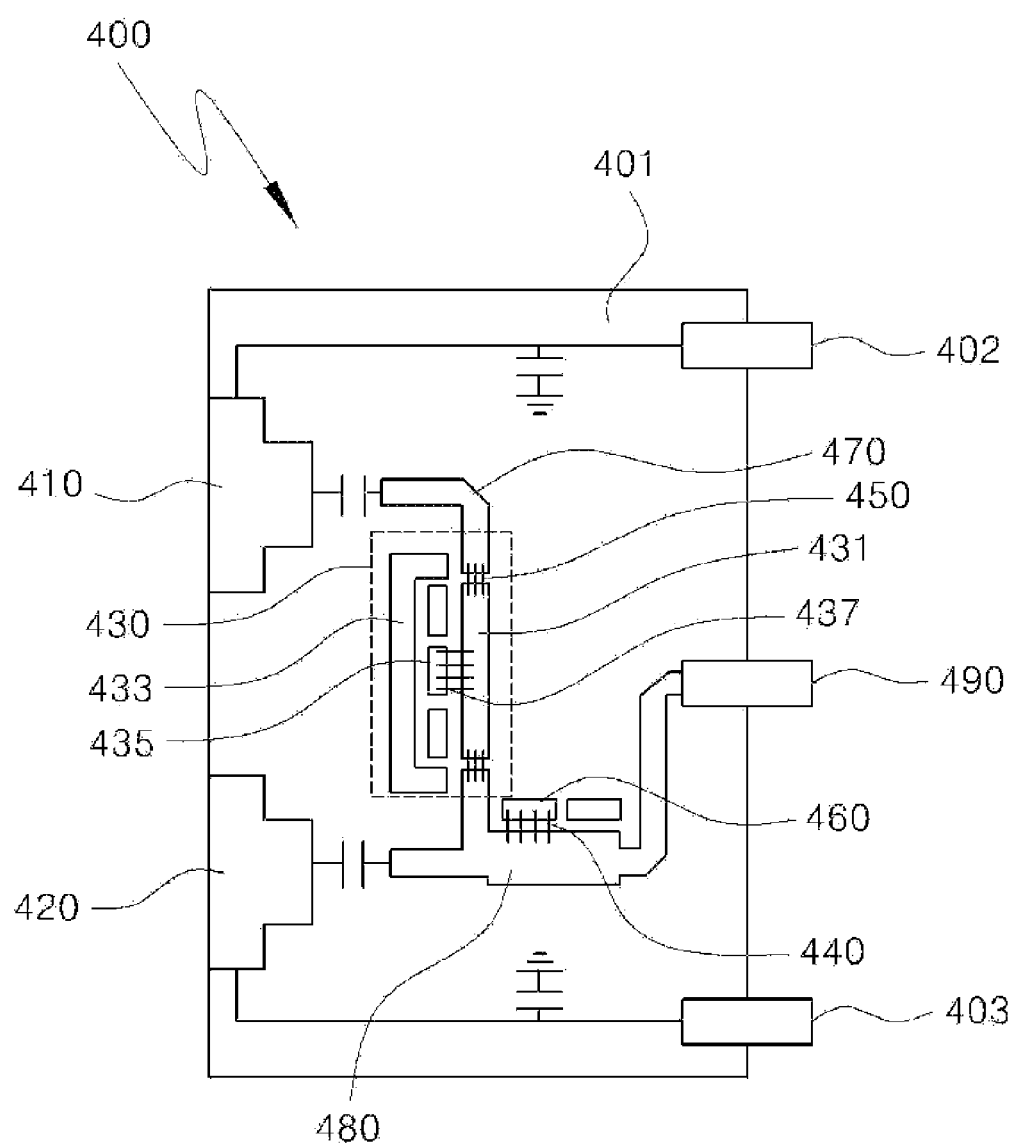
[FIG. 5]

DOHERTY AMPLIFIER

CROSS-REFERENCE TO RELATED APPLICATIONS

Related Applications

The present application is a continuation of International Application Number PCT/KR2010/007696 filed Nov. 3, 2010, the disclosure of which is hereby incorporated by reference herein in their entirety. Further, this application claims the priority of Korean Patent Application No. 10-2009-0105746, filed on Nov. 4, 2009 in the KIPO (Korean Intellectual Property Office), the disclosure of which are incorporated herein in their entirety by reference.

TECHNICAL FIELD

This disclosure relates to a Doherty amplifier and, more particularly, to a Doherty amplifier which can achieve impedance matching optimized by an improved impedance converter.

BACKGROUND

Recently, with the increased use of digital communication systems with a high peak-to-average power ratio (PAR) of signals such as WCDMA, WiBro, WiMAX, LTE, etc., there is a need to improve the linearity and efficiency of a power amplifier that is responsible for signal amplification in the corresponding system. Moreover, with the development of digital pre-distortion (PDP) linearity technologies along with the demand for miniaturization of the system, the use of a Doherty amplifier which is suitable for applying to the DPD linearity technologies and can reduce the power consumption and size has increased.

At present, the Doherty amplifier is fabricated using an FR-4 substrate having a dielectric constant of 4.8 or a Teflon substrate having a dielectric constant of 3.5. However, with the substrate having such low dielectric constants, it is difficult to reduce the size of the Doherty amplifier.

In general, an input of the Doherty amplifier comprises a distributor for distributing signals and a delay line for a phase delay of 90 degrees, and an output of the Doherty amplifier comprises matching circuits for output matching of the power amplifier and a 90-degree delay line for coupling outputs of a carrier amplifier and a peaking amplifier. Impedance varies in a region where the outputs of the carrier amplifier and the peaking amplifier are combined, and thus the Doherty amplifier further comprises an impedance conversion circuit for converting the impedance into the impedance of the output side. In order to obtain a desired impedance by the impedance conversion circuit, tuning of the impedance conversion circuit is required. In the case of a high power transistor, the tuning is performed by changing a pattern of a line or attaching a capacitor. However, the tuning in this manner reduces the efficiency of the operation and cannot achieve uniform quality, which are very problematic.

Meanwhile, a package comprising a metal such as Cu/Mo/Cu or CuW is used in the carrier amplifier and the peaking amplifier to fabricate a high power Doherty amplifier, and the use of this package increases the cost. Moreover, a structure in which transistors that constitute the carrier amplifier and the peaking amplifier are attached to the metal package basically occupies a large area, which becomes an obstacle to the miniaturization, and a fixing method using a screw also hinders the miniaturization.

Technical Solution

In one aspect, the embodiment provides a Doherty amplifier comprising an impedance converter including a plurality of lines having different lengths and disposed between an output end of a carrier amplifier and an output end of a peaking amplifier and a connector for connecting a line selected from the plurality of lines having different lengths of the impedance converter to the output end of the carrier amplifier and to the output end of the peaking amplifier.

Here, the connector may be connected to both ends of the selected line.

The connector may be a wire bonding.

The impedance converter may further comprise a satellite pad for adjusting the impedance of the line and a satellite pad connector for connecting the satellite pad to the line. Here, the satellite pad connector may be a wire bonding.

The Doherty amplifier may further comprise a carrier compensation line connected to the output end of the carrier amplifier and a peaking compensation line connected to the output end of the peaking amplifier, and the connector may connect the line selected from the impedance converter to the carrier compensation line and the peaking compensation line.

The carrier amplifier and the peaking amplifier may comprise gallium nitride (GaN) transistors.

Moreover, the carrier amplifier and the peaking amplifier may be attached to a thermal transfer pad by an adhesive. The back of the pad may be attached to a heat sink, and the heat sink may comprise a fastening hole through which a screw fastened to a main board is inserted.

In another aspect, the embodiment provides a Doherty amplifier comprising: an amplification unit including a carrier amplifier and a peaking amplifier; an input module including, on a single substrate, a high-frequency input terminal, a distributor for distributing input signals input through the high-frequency input terminal, a carrier input matching circuit receiving the distributed signal and connected to an input end of the carrier amplifier, a peaking input matching circuit receiving the distributed signal and connected to an input end of the peaking amplifier, and a delay line disposed between the distributor and the peaking input matching circuit; and an output module including, on a single substrate, a carrier output matching circuit connected to an output end of the carrier amplifier, a peaking output matching circuit connected to an output end of the peaking amplifier, a carrier compensation line connected to an output end of the carrier output matching circuit, a peaking compensation line connected to an output end of the peaking output matching circuit, a first impedance converter connecting the carrier compensation line and the peaking compensation line, a second impedance converter connected to the peaking compensation line, and a high-frequency output terminal connected to the second impedance converter.

Here, the amplification unit, the input module, and the output module may be separated from each other.

The amplification unit may comprise a heat sink attached to the carrier amplifier and the peaking amplifier.

The first impedance converter may comprise a plurality of lines having different lengths, and a line selected from the impedance converter may be connected to the carrier compensation line and the peaking compensation line.

Here, at least one of the delay line, the first impedance converter, and the second impedance converter may further comprise a satellite pad provided around each of the delay line, the first impedance converter, and the second impedance converter to adjust the impedance.

The satellite pad may be connected to the delay line, the first impedance converter, and the second impedance converter through wire bonding.

Moreover, the delay line may comprise a plurality of lines having different lengths, and a selected line may be connected to the distributor and the peaking input matching circuit.

BRIEF DESCRIPTION OF THE DRAWINGS

FIG. 1 is a schematic diagram showing a typical Doherty amplifier.

FIG. 2 is a schematic diagram showing a Doherty amplifier in accordance with an embodiment.

FIG. 3 is a schematic diagram showing a Doherty amplifier in accordance with another embodiment.

FIG. 4 is a schematic diagram showing an input module of a Doherty amplifier in accordance with an embodiment.

FIG. 5 is a schematic diagram showing an output module of a Doherty amplifier in accordance with an embodiment.

DESCRIPTION OF REFERENCE NUMERALS OF MAIN PARTS IN THE DRAWINGS

- 110, 210: carrier amplifier
- 120, 220: peaking amplifier
- 130, 430: impedance converter
- 131, 133, 431, 433: line
- 135, 360, 435, 460: satellite pad
- 137, 440, 437, 370: satellite pad connector
- 150, 450: connector
- 170, 470: carrier compensation line
- 180: peaking compensation line
- 380: carrier input matching circuit
- 390: peaking input matching circuit
- 410: carrier output matching circuit
- 420: peaking output matching circuit
- 211, 221: heat transfer pad
- 230: heat sink 231: fastening hole

DETAILED DESCRIPTION OF THE EMBODIMENT

Hereinafter, exemplary embodiments of the present invention will be described in detail with reference to the accompanying drawings.

It is apparent, however, to one skilled in the art that some embodiments of the invention may be practiced without these specific details or with an equivalent arrangement. In other instances, well-known structures and devices are shown in block diagram form in order to simplify the drawings.

A Doherty amplifier according to the embodiment will be described in more detail with reference to the accompanying drawings.

A Doherty amplifier is a high efficiency modulation amplifier for a high power transmitter, which is configured to control and combine the phase of an output of a main amplifier for amplifying a basic signal and that of an auxiliary amplifier for amplifying a peak signal. The Doherty amplifier was invented by William H. Doherty in 1936, in which a main amplifier has an operating point of Class B and an auxiliary amplifier has an operating point of Class C, the auxiliary amplifier starting its operation at a time when the main amplifier is saturated.

FIG. 1 is a schematic diagram showing a typical Doherty amplifier.

Referring to FIG. 1, reference numeral 10 denotes a distributor for distributing inputs, reference numeral 20 denotes a carrier amplifier, reference 30 denotes a peaking amplifier, reference numeral 40 denotes an offset line, and each of reference numerals Z1, Z2 and Z3 denotes a characteristic impedance value having a phase angle shown in the drawing.

The Doherty amplifier has the following structure. Input matching circuits 21 and 31 are connected to front ends of the carrier amplifier 20 and the peaking amplifier 30, and output matching circuits 23 and 33 are connected to output ends of the carrier amplifier 20 and the peaking amplifier 30 such that a certain impedance is RO. Moreover, an impedance line 41 is connected to a rear end of the output matching circuit 23 of the carrier amplifier 20, and an impedance line 43 is connected to a rear end of the output matching circuit 33 of the peaking amplifier 30.

Here, the final outputs of the carrier amplifier 20 and the peaking amplifier 30 are connected to quarter-wave transformers Z2 and Z3 to cause a Doherty operation.

Moreover, an impedance line Z1 is connected in front of the input matching circuit 31 of the peaking amplifier 30 to compensate for a phase difference between the impedance lines 41 and 43 including the quarter-wave transformers Z2 and Z3.

According to the method shown in FIG. 1 the matching circuits 23 and 33 are provided at outputs of transistors Q1 and Q2 and the offset lines 41 and 43 are disposed at the rear of the matching circuits 23 and 33 to achieve matching of imaginary parts of the impedance as well as matching of real parts of the impedance, thereby inducing a Doherty operation while obtaining the maximum output of the amplifier.

However, in a real environment, the fabrication characteristics of the carrier amplifier and the peaking amplifier, which constitute the Doherty amplifier, are different for each device, and thus it is necessary to change the quarter-wave transformer Z2 in each Doherty amplifier. To this end, tuning is performed by changing a line pattern of the quarter-wave transformer Z2 or attaching a capacitor. However, it is necessary to perform this operation for each Doherty amplifier, which reduces the productivity. In particular, in the case of a Doherty amplifier fabricated in miniature to meet the miniaturization trend, it is difficult to apply the above method, and thus the Doherty amplifier may be used without optimizing the output signal.

FIG. 2 is a schematic diagram showing a Doherty amplifier in accordance with an embodiment.

The Doherty amplifier shown in FIG. 2 comprises a plurality of lines 131 and 133 having different lengths, an impedance converter 130 disposed between an output end of a carrier amplifier 110 and an output end of a peaking amplifier 120, and a connector 150 for connecting a line selected from the impedance converter 130 to the output end of the carrier amplifier 110 and the output end of the peaking amplifier 120.

The impedance converter 130 is an element corresponding to the quarter-wave transformer Z2 of FIG. 1 and compensates for signal delay (λ/4) due to the impedance line Z1. Although the characteristics of the carrier amplifier 110 and the peaking amplifier 120 and those of other elements that constitute the Doherty amplifier are determined during design, it is necessary to adjust the impedance of the quarter-wave transformer Z2 due to a difference in the characteristics of the carrier amplifier 110 and the peaking amplifier 120, which are caused during actual fabrication, and due to a difference in the characteristics of other elements. While the impedance can be adjusted by changing the length of the quarter-wave transformer Z2, i.e., the impedance converter 130, it is not easy to control the circuit pattern of the impedance converter 130 all the time.

Therefore, in the present embodiment, the plurality of lines 131 and 133 having different lengths are provided in the impedance converter 130 such that a line for an optimized output can be selected and used. Of course, to this end, it is necessary to check the range of the length change through experiments and to form a predetermined number of lines having different lengths. The formation of a plurality of lines may be performed during fabrication of the pattern including the impedance converter 130, and thus a user may select an optimized line and connect the line to the output end of the carrier amplifier 110 and the output end of the peaking amplifier 120.

Such a connection is performed by the connector 150, and the connector may be a wire bonding. One end of the connector is connected to both ends of a selected line (the line optimized in each Doherty amplifier is selected by the user through inspection), and the other end is connected to the output end of the carrier amplifier 110 and the output end of the peaking amplifier 120.

While FIG. 2 shows the state where the line 131 is connected, it can be seen that the line 133 may be connected by the control of the connector. Moreover, while FIG. 2 shows two lines 131 and 133, a greater number of lines may be formed depending on the characteristics of each Doherty amplifier.

Meanwhile, even in the case where the selected line is connected to the output end of the carrier amplifier 110 and the output end of the peaking amplifier 120, the corresponding line cannot cover all the range of the length change but covers only a discrete length. Therefore, the optimization is not likely to be made within a predetermined range. To solve this problem, a separate satellite pad is disposed around the lines and connected to the line through a satellite pad connector.

That is, the impedance converter 130 may further comprise a satellite pad 135 for adjusting the impedance of the lines 131 and 133 and a satellite pad connector 137 for connecting the satellite pad 135 to the line. The size of the satellite pad 135 should be determined through experiments, and a plurality of satellite pads may be present. Moreover, for connection to the line in the impedance converter 130, it is desirable that the satellite pad should be disposed adjacent to the line in an electrically isolated state. In the case of a plurality of satellite pads, any one of the satellite pads may be connected to the line, or more than two satellite pads may be connected to the line.

The satellite pad connector 137 may be a wire bonding like the connector described above, and other various methods capable of electrically connecting the satellite pad to the line may be employed.

Meanwhile, the Doherty amplifier typically includes a compensation line disposed between the output end of the carrier amplifier 110 and the output end of the peaking amplifier 120, like the offset line of FIG. 2.

Thus, the Doherty amplifier of FIG. 2 may further comprise a carry compensation line 170 connected to the output end of the carrier amplifier 110 and a peaking compensation line 180 connected to the output end of the peaking amplifier 120. In this case, the connector 150 connects the line 131 selected from the impedance converter 130 to the carrier compensation line 170 and the peaking compensation line 180.

In the case where there are provided a carrier output matching circuit for matching the output of the carrier amplifier and a peaking output matching circuit for matching the output of the peaking amplifier 120, the carrier output matching circuit is disposed between the carrier amplifier and the carrier compensation line 170, and the peaking output matching circuit is disposed between the peaking amplifier 120 and the peaking compensation line 180.

As mentioned above, the Doherty amplifier in accordance with the present embodiment includes the impedance converter having a plurality of lines having different lengths, and thus if a certain line is selected and connected through the connector, an optimum output can be obtained. Moreover, if the connection is not made properly, only the location of the connector may be changed without modifying the pattern, and thus the maintenance is also facilitated.

The carrier amplifier 110 and the peaking amplifier 120 may comprise a gallium nitride (GaN) transistor, respectively. The use of the gallium nitride transistors can provide high output amplification even with a small size.

Meanwhile, the carrier amplifier 110 and the peaking amplifier 120 may be attached to a heat transfer pad by an adhesive, which is shown in FIG. 3.

Referring to FIG. 3, a carrier amplifier 210 and a peaking amplifier 220 may be attached to heat transfer pads 211 and 221, respectively. The attachment of the carrier amplifier 210 to the pad 211 and the attachment of the peaking amplifier 220 to the pad 221 may be made by an adhesive, not a screw. According to the, a hole through which a screw is fastened is not required in each of the carrier amplifier 210 and the peaking amplifier 220. Accordingly, it is possible to further miniaturize the carrier amplifier 210 and the peaking amplifier 220 themselves.

Typically, an amplifier generates a lot of heat due to its nature, and thus a heat sink is used to prevent the amplifier from being damaged by the heat.

The carrier amplifier 210 and the peaking amplifier 220 also use such a heat sink, which is attached to the back of each pad to which the carrier amplifier 210 and the peaking amplifier 220 are attached. Here, the attachment is made by an adhesive, and the heat generated from each amplifier can be efficiently transferred to the heat sink since the pad is made of a heat transfer material.

Conventionally, a fastening hole formed in each of the carrier amplifier and the peaking amplifier is used to fasten each amplifier to the heat sink. According to the present embodiment, the connection between the amplifier and the heat sink is made by the heat transfer pad.

FIG. 3 is a schematic diagram showing a Doherty amplifier in accordance with another embodiment.

The Doherty amplifier shown in FIG. 3 comprises an amplification unit 200, an input module 300, and an output module 400.

The amplification unit 200 comprises the carrier amplifier 210 and the peaking amplifier 220. Moreover, a heat sink 230 for dissipating heat generated from the carrier amplifier 210 and the peaking amplifier 220 is attached to the amplification unit 200. Here, the heat sink 230 may be divided into a heat sink for the carrier amplifier 210 and a heat sink for the peaking amplifier 220. However, it is desirable that the distance between the amplifiers should be fixed, and thus it is desirable that the respective amplifiers should be attached to an integrated heat sink. Thus, the carrier amplifier 210 and the peaking amplifier 220 are disposed at a predetermined interval.

The carrier amplifier 210 and the peaking amplifier 220 may be attached to the heat sink by the heat transfer pad described above, and to this end, both sides of the pad should be coated with an adhesive or provided with an adhesive layer. Thus, compared to the existing method of fastening the amplifier to the heat sink using a screw, a hole or fastening portion for screw fastening is not required, which is advantageous for miniaturization of the amplifier. While FIG. 3 shows a large heat sink, if a heat sink having a width from the top of the carrier amplifier 210 to the bottom of the peaking amplifier 220 is used, it is also possible to reduce the size of each amplifier compared to the screw fastening method. In the case of the screw fastening method, a hole or fastening portion is formed on each of the top and bottom of each amplifier, and thus the size of the heat sink can be reduced by the length of the hole or fastening portion.

As shown in FIG. 4, the input module 300 comprises a high-frequency input terminal 320, a distributor 340, a carrier input matching circuit 380, a peaking input matching circuit 390, and a delay line 350. The respective elements are formed on a single substrate 301.

The high-frequency input terminal 320 is a terminal through which a high-frequency signal to be amplified by the Doherty amplifier is input.

The distributor 340 distributes high-frequency signals input through the high-frequency input terminal 320 to the carrier amplifier 210 and the peaking amplifier 220.

The carrier input matching circuit 380 receives the signal distributed by the distributor and is connected to an input end of the carrier amplifier 210 to match the input impedance of the input end of the carrier amplifier 210.

The peaking input matching circuit 390 receives the signal distributed by the distributor and is connected to an input end of the peaking amplifier to match the input impedance of the input end of the peaking amplifier 220.

In addition, the input module 300 may further comprise power supply terminals 310 and 330 for supplying electric power to the carrier input matching circuit 380 and the peaking input matching circuit 390.

A satellite pad 360 for adjusting the impedance may be provided around the delay line 350. The number, size and position of the satellite pad 360 may be appropriately selected to be suitable for the impedance adjustment of the delay line 350. The satellite pad 360 may be connected to the delay line 350 through a satellite pad connector 370. If the connection is not made properly, the satellite pad connector 370 should be detachable, and thus the satellite pad connector 370 is preferably a wire bonding.

As shown in FIG. 5, the output module 400 comprises a carrier output matching circuit 410, a peaking output matching circuit 420, a carrier compensation line 470, a peaking compensation line 480, a first impedance converter 430, a second impedance converter 480, and a high-frequency output terminal 490. The respective elements are formed on a single substrate 401, and the peaking compensation line 480 and the second impedance converter 480 are integrated in FIG. 5.

The carrier output matching circuit 410 matches the output impedance of the carrier amplifier.

The peaking output matching circuit 420 matches the output impedance of the peaking amplifier.

The carrier compensation line 470 is connected to an output end of the carrier output matching circuit 410 and corresponds to the offset line of FIG. 1.

The peaking compensation line 480 is connected to an output end of the peaking output matching circuit 420 and also corresponds to the offset line of FIG. 1.

The first impedance converter 430 compensates for the delay line of the input module and connects the carrier compensation line 470 and the peaking compensation line 480. In detail, the first impedance converter 430 of the Doherty amplifier is located at an output end of the carrier compensation line 470. Thus, one end of the first impedance converter 430 is connected to the carrier compensation line 470 and the other end is connected to a contact between the peaking compensation line 480 and the high-frequency output terminal 490. The first impedance converter 430 corresponds to the Z2 of FIG. 1.

The second impedance converter 480 is connected to the peaking compensation line 480 and, particularly, located between the peaking compensation line 480 and the high-frequency output terminal 490. The second impedance converter 480 corresponds to the Z3 of FIG. 1. The peaking compensation line 480 and the second impedance converter 480 are integrated in FIG. 5. In detail, the line extending from the contact between the peaking compensation line 480 and the second impedance converter 480 toward the peaking output matching circuit 420 corresponds to the peaking compensation line 480, and the line whose width extends to the high-frequency output terminal 490 corresponds to the second impedance converter 480.

The high-frequency output terminal 490 is connected to the second impedance converter 480 such that the signals amplified by the carrier amplifier and the peaking amplifier are combined and output.

In addition, the output module 400 may further comprise power supply terminals 402 and 403 for supplying electric power to the carrier output matching circuit 410 and the peaking output matching circuit 420.

According to the above description, the Doherty amplifier comprises the amplification unit, the input module, and the output module, and each of the input module and the output module is formed on a single substrate. Thus, the input module and the output module can be separated from each other. Therefore, it is possible to separately fabricate the amplification unit, the input module, and the output module and to replace any one of them. As a result, since the Doherty amplifier can be modularized into three modules, the productivity is improved and the maintenance is facilitated.

Meanwhile, the first impedance converter 430 in the output module 400 may comprise a plurality of lines having different lengths as described with reference to FIG. 2.

According to this, the Doherty amplifier comprises: the amplification unit 200 including the carrier amplifier 210 and the peaking amplifier 220; the input module 300 including, on a single substrate, the high-frequency input terminal 320, the distributor 340 for distributing input signals input through the high-frequency input terminal 320, the carrier input matching circuit 380 receiving the distributed signal and connected to the input end of the carrier amplifier 210, the peaking input matching circuit 390 receiving the distributed signal and connected to the input end of the peaking amplifier 220, and the delay line 350 disposed between the distributor 340 and the peaking input matching circuit 390; and the output module 400 including, on a single substrate, the carrier output matching circuit 410 connected to the output end of the carrier amplifier 210, the peaking output matching circuit 420 connected to the output end of the peaking amplifier 220, the carrier compensation line 470 connected to the output end of the carrier output matching circuit 410, the peaking compensation line 480 connected to the output end of the peaking output matching circuit 420, the first impedance converter 430 connecting the carrier compensation line 470 and the peaking compensation line 480, the second impedance converter 480 connected to the peaking compensation line 480, and the high-frequency output terminal 490 connected to the second impedance converter 480, wherein the first impedance converter 430 comprises a plurality of lines 431 and 433 having different lengths such that a line selected from the first impedance converter 430 may be connected to the carrier compensation line 470 and the peaking compensation line 480.

Of course, the amplification unit, the input module, and the output module can be separated from each other as mentioned above.

The first impedance converter 430 may comprise a plurality of lines having different lengths, and a line is selected from the plurality of lines and connected to the carrier compensation line 470 and the peaking compensation line 480 through a connector 450. Here, the connector 450 may be a wire bonding, and other various means capable of electrically connecting the line are applicable. However, it is desirable that the connector 450 should be able to be easily connected and disconnected by a user, like a wire bonding, to correspond to the configuration of the first impedance converter 430 for the purpose of improving the productivity and facilitating the maintenance.

Moreover, as described in the embodiment of FIG. 2, the first impedance converter 430 may further comprise a satellite pad 435 disposed around the plurality of lines for precise impedance matching and connected to a line selected from the plurality of lines through a satellite pad connector 437. The satellite pad connector 437 may also be a wire bonding, like the connector 450.

Meanwhile, a satellite pad may be disposed around the delay line 350 of the input module 300 and the second impedance converter 480 of the output module 400, if necessary, such that an optimum output signal can be output from the high-frequency output terminal 490 of the output module 400. That is, like reference numerals 360 of FIG. 4 or 460 of FIG. 5, a satellite pad may be disposed around the delay line 350 or around the second impedance converter 480 and connected to the delay line 350 or to the second impedance converter 480 through a satellite pad connector 370 or 440.

In summary, the satellite pad may be formed around at least one of the delay line 350, the first impedance converter 430, and the second impedance converter 480. Here, the each of the delay line 350, the first impedance converter 430, and the second impedance converter 480 may be connected to the satellite pad through the satellite pad connector like a wire bonding.

Moreover, the delay line 350 may comprise a plurality of lines having different lengths, if necessary, to allow the user to select a line from the plurality of lines, like the first impedance converter 430.

Here, the line selected by the user will be connected to the distributor 340 and the peaking input matching circuit 390. Of course, the connector is used for the connection, and the connector may be a wire bonding.

The foregoing may be summarized as follows. The Doherty amplifier comprises the input module 300 and the output module, in which the circuits are integrated on a high-dielectric constant substrate, and the amplification unit 200, which includes the gallium nitride transistors (i.e., the carrier amplifier and the peaking amplifier) attached to the heat transfer pads 211 and 221 attached to the heat sink made of a metal such as aluminum or copper. The high power transistors attached to the heat transfer pads 211 and 221 can easily transfer the heat to the heat sink to be dispersed.

A gate pad of the gallium nitride transistor is connected to each of the input matching circuits 380 and 390 of the input module 300 by wire bonding, and a drain pad is connected to each of the output matching circuits 410 and 420 of the output module 400 by wire bonding. Thus, a high-frequency signal is separated from the signal, input through the high-frequency input terminal 320, by the distributor 340 and the delay line 350 (λ/4), input through the wire bonding, and then amplified. The amplified signal is output through the drain pad of the transistor and the wire bonding, passes through the output matching circuits 410 and 420 to be combined, and then output through the high-frequency output terminal 490.

Here, a voltage should be supplied to the gate and drain of each transistor to activate the gallium nitride transistors, and thus each transistor has a terminal for supplying electric power to the gate and a terminal for supplying electric power to the drain.

The Doherty amplifier fabricated in the above manner has four fastening holes 231 for attaching the heat sink (to which the input module and the output module are attached) to a metal plate of a main board (not shown) such that the Doherty amplifier can be mounted to the main board. The Doherty amplifier may be fastened to the main board through the fastening holes 231, and the respective terminals 310, 320, 330, 402, 490 and 403 of the input module 300 and the output module 400 may be connected to the pads of the main board.

Signals input through the high-frequency input terminal 320 are distributed by the distributor 340 such that a portion of the signals are input to the carrier amplifier 210 located at the top, and some of the signals are input to the peaking amplifier 220 through the delay line 350. Here, due to a difference in characteristics between the high power transistors, the impedance of the delay line 350 should be adjusted to provide optimum output performance. However, it is very difficult to adjust the impedance of the delay line 350 due to the reduced pattern of the high-dielectric constant substrate. Thus, when the satellite pad 360 provided around the delay line 350 is connected to the delay line 350 using the satellite pad connector 370 (i.e., wire bonding), it is possible to perform precise and constant operations.

The high-frequency signals amplified by the carrier gallium nitride transistor and the peaking gallium nitride transistor pass through the output matching circuits, respectively, pass through the impedance converter, and then exit to the outside through the high-frequency output terminal. Here, when the impedance matching for the output signals is made optimally, the maximum efficiency can be obtained. Therefore, it is necessary to adjust the length and impedance of the line of the first impedance converter according to the characteristics of the used carrier transistor and peaking transistor. Since the amplifier is miniaturized by the use of the high-dielectric constant substrate as mentioned above, it is not easy to modify the length and impedance of the line. Thus, the first impedance converter 430 has the second line 433 and the satellite pad 435 to change the length and impedance of the line using the satellite pad connector 437 (i.e., wire bonding). A line having a desired length may be selected from the first impedance converter 430, and if the length of the lines 470, 431, and 480 connected by the connector 450 (i.e., wire bonding) is too short to optimize the performance, the longer lines 470, 433, and 480 connected by the wire bonding may be used. If the selected line requires the impedance matching to have optimal characteristics, the line may be connected to the satellite pads 435 and 460 through the satellite pad connectors 437 and 440. As such, it is possible to easily change the length of the line and perform the impedance matching by means of the wire bonding, and thus it is possible to perform regular and accurate operations.

Although exemplary embodiments of the present disclosure have been described for illustrative purposes, those skilled in the art will appreciate that various modifications, additions and substitutions are possible, without departing from the scope and spirit of the disclosure. Therefore, exemplary embodiments of the present disclosure have not been described for limiting purposes. Accordingly, the scope of the disclosure is not to be limited by the above embodiments but by the claims and the equivalents thereof.

The invention claimed is:

1. A Doherty amplifier comprising:
an impedance converter including a plurality of lines having different lengths and disposed between an output end of a carrier amplifier and an output end of a peaking amplifier; and
two connectors for connecting a line selected from the plurality of lines having different lengths of the impedance converter to the output end of the carrier amplifier and to the output end of the peaking amplifier respectively,
wherein the impedance converter further comprises:
a satellite pad for adjusting the impedance of the line; and
a satellite pad connector for connecting the satellite pad to the line.

2. The Doherty amplifier of claim 1, wherein the connectors are wire-bonded.

3. The Doherty amplifier of claim 1, wherein the satellite pad connector is wire-bonded.

4. The Doherty amplifier of claim 1, further comprising:
a carrier compensation line connected to the output end of the carrier amplifier; and
a peaking compensation line connected to the output end of the peaking amplifier,
wherein the connectors connect the line selected from the impedance converter to the carrier compensation line and the peaking compensation line.

5. The Doherty amplifier of claim 1, wherein the carrier amplifier and the peaking amplifier comprise gallium nitride (GaN) transistors.

6. The Doherty amplifier of claim 1, wherein the carrier amplifier and the peaking amplifier are attached to a thermal transfer pad by an adhesive.

7. The Doherty amplifier of claim 6, wherein a heat sink is attached to the other side of the pad.

8. The Doherty amplifier of claim 7, wherein the heat sink comprises a fastening hole through which a screw fastened to a main board is inserted.

9. A Doherty amplifier comprising:
an amplification unit including a carrier amplifier and a peaking amplifier;
an input module including, on a single substrate, a high-frequency input terminal, a distributor for distributing input signals input through the high-frequency input terminal, a carrier input matching circuit 380 receiving the distributed signal and connected to an input end of the carrier amplifier, a peaking input matching circuit receiving the distributed signal and connected to an input end of the peaking amplifier, and a delay line disposed between the distributor and the peaking input matching circuit; and
an output module including, on a single substrate, a carrier output matching circuit connected to an output end of the carrier amplifier, a peaking output matching circuit connected to an output end of the peaking amplifier, a carrier compensation line connected to an output end of the carrier output matching circuit, a peaking compensation line connected to an output end of the peaking output matching circuit, a first impedance converter connecting the carrier compensation line and the peaking compensation line, a second impedance converter connected to the peaking compensation line, and a high-frequency output terminal connected to the second impedance converter,
wherein the amplification unit, the input module, and the output module are separable from each other.

10. The Doherty amplifier of claim 9, wherein the amplification unit comprises a heat sink attached to the carrier amplifier and the peaking amplifier.

11. The Doherty amplifier of claim 9, wherein the first impedance converter comprises a plurality of lines having different lengths.

12. The Doherty amplifier of claim 11, wherein at least one of the delay line, the first impedance converter, and the second impedance converter further comprises a satellite pad provided around each of the delay line, the first impedance converter, and the second impedance converter to adjust the impedance.

13. The Doherty amplifier of claim 12, wherein the satellite pad is connected to the delay line, the first impedance converter, and the second impedance converter through wire bonding.

14. The Doherty amplifier of claim 13, wherein the delay line comprises a plurality of lines having different lengths, and a selected line is connected to the distributor and the peaking input matching circuit.

* * * * *